(12) United States Patent
Chang

(10) Patent No.: US 11,791,179 B2
(45) Date of Patent: Oct. 17, 2023

(54) SUBSTRATE TREATING APPARATUS AND SUBSTRATE TREATING METHOD

(71) Applicant: SEMES CO., LTD., Chungcheongnam-do (KR)

(72) Inventor: Bu Yong Chang, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 974 days.

(21) Appl. No.: 16/682,326

(22) Filed: Nov. 13, 2019

(65) Prior Publication Data

US 2020/0192308 A1   Jun. 18, 2020

(30) Foreign Application Priority Data

Dec. 12, 2018 (KR) .......................... 10-2018-0159796

(51) Int. Cl.
*H01L 21/67* (2006.01)
*G05B 15/02* (2006.01)
*H01L 21/687* (2006.01)

(52) U.S. Cl.
CPC ........ *H01L 21/67167* (2013.01); *G05B 15/02* (2013.01); *H01L 21/68707* (2013.01)

(58) Field of Classification Search
CPC ........ H01L 21/67167; H01L 21/68707; G05B 15/02
See application file for complete search history.

(56) References Cited

U.S. PATENT DOCUMENTS

| 8,447,422 | B2 | 5/2013 | Yoshida et al. |
| 2011/0046765 | A1 | 2/2011 | Yamagami |

(Continued)

FOREIGN PATENT DOCUMENTS

| KR | 20110037896 A | 4/2011 |
| KR | 101110137 B1 | 1/2012 |

(Continued)

OTHER PUBLICATIONS

Korean Office Action for Korean Patent Application No. 10-2018-0159796, dated Feb. 27, 2020, 9 pages.

*Primary Examiner* — Feifei Yeung Lopez
(74) *Attorney, Agent, or Firm* — RatnerPrestia

(57) ABSTRACT

A substrate treating apparatus and a substrate treating method are disclosed. The substrate treating apparatus includes a process module configured to perform processing on a substrate, an index module configured to insert the substrate into the process module and withdraw the substrate, of which the processing is completed, from the process module, a loading module configured to relay the substrate between the process module in a vacuum atmosphere and the index module in an atmospheric pressure atmosphere by switching an atmosphere thereof to the vacuum atmosphere or the atmospheric pressure atmosphere, and a control module configured to receive operation states from the process module, the index module, and the loading module and schedule operations of the process module, the index module, and the loading module in a direction in which the number of substrates to be processed per unit time increases with reference to the received operation states.

20 Claims, 8 Drawing Sheets

(56) References Cited

U.S. PATENT DOCUMENTS

| | | | | |
|---|---|---|---|---|
| 2013/0325773 | A1* | 12/2013 | Sinyavskiy | G06N 20/00 706/23 |
| 2014/0099176 | A1* | 4/2014 | Nogi | H01L 21/67745 414/217 |
| 2019/0286983 | A1* | 9/2019 | Jung | G05B 17/02 |

FOREIGN PATENT DOCUMENTS

| KR | 20140046983 A | 4/2014 |
|---|---|---|
| KR | 20180061769 A | 6/2018 |

* cited by examiner

SUBSTRATE TREATING APPARATUS AND SUBSTRATE TREATING METHOD

CROSS-REFERENCE TO RELATED APPLICATIONS

This application claims priority from Korean Patent Application No. 10-2018-0159796 filed on Dec. 12, 2018 in the Korean Intellectual Property Office, the disclosure of which is incorporated herein by reference in its entirety.

BACKGROUND

1. Field of the Disclosure

The present disclosure relates to a substrate treating apparatus and a substrate treating method.

2. Description of Related Art

When manufacturing a semiconductor device or a display device, various processes such as photolithography, etching, ashing, ion implantation, thin film vapor-deposition, cleaning, and the like are performed. Here, the photolithography process includes a coating process, an exposure process, and a developing process. A photoresist is applied onto a substrate (that is, a coating process), a circuit pattern is exposed on the substrate formed with a photoresist film (that is, an exposure process), and an exposed area of the substrate is selectively developed (that is, a developing process).

Various processes may be performed in one processing equipment. To this end, the equipment may include a plurality of process modules performing different processes. The substrate of which the process has been completed may be withdrawn from the equipment and moved to another processing equipment while being accommodated in a carrier.

SUMMARY

Aspects of the present disclosure provide a substrate treating apparatus and a substrate treating method.

It should be noted that objects of the present disclosure are not limited to the above-described objects, and other objects of the present disclosure will be apparent to those skilled in the art from the following descriptions.

According to an aspect of the present disclosure, there is provided a substrate treating apparatus including a process module configured to perform processing on a substrate, an index module configured to insert the substrate into the process module and withdraw the substrate, of which the processing is completed, from the process module, a loading module configured to relay the substrate between the process module in a vacuum atmosphere and the index module in an atmospheric pressure atmosphere by switching an atmosphere thereof to the vacuum atmosphere or the atmospheric pressure atmosphere, and a control module configured to receive operation states from the process module, the index module, and the loading module and schedule operations of the process module, the index module, and the loading module in a direction in which the number of substrates to be processed per unit time increases with reference to the received operation states.

The operation state may include at least one from among a main-processing state or a post-processing state of at least one process unit provided in the process module, a substrate transport state of at least one transport arm provided in a transport robot of the process module, a substrate transport state of at least one index arm provided in an index robot of the index module, and an exhaust state or an intake state of a load lock chamber and an unload lock chamber that are provided in the loading module.

The control module may schedule the operations of the process module, the index module, and the loading module in a direction in which an idle time of at least one process unit provided in the process module, an idle time of a transport robot provided in the process module, and an idle time of an index robot provided in the index module are reduced.

The control module may schedule the operations of the process module, the index module, and the loading module with reference to environment information of the process module, the index module, and the loading module.

The environment information may include at least one from among a main-processing time and a post-processing time of at least one process unit provided in the process module, the number of available transport arms provided in a transport robot of the process module, the number of available index arms provided in an index robot of the index module, and an exhaust time and an intake time of each of a load lock chamber and an unload lock chamber that are provided in the loading module.

The control module may generate and transmit equipment control information for scheduling the operations of the process module, the index module, and the loading module.

The equipment control information may include at least one equipment control element for controlling each piece of equipment provided in the process module, the index module, and the loading module.

The equipment control element may include at least one from among a time point at which the substrate accommodated in a carrier of the index module is withdrawn for processing, a time point at which the substrate is transported from a load lock chamber of the loading module to the process module, a time point at which the substrate is transported from an unload lock chamber of the loading module to the index module, and a processing priority in the case in which the substrate before processing and the substrate after processing are mixed in the load lock chamber of the loading module.

The control module may learn the scheduled operation states of the process module, the index module, and the loading module using a machine learning technique to newly schedule the operations of the process module, the index module, and the loading module.

The machine learning technique may include reinforcement learning.

The control module may include a reception part configured to receive the operation states from the process module, the index module, and the loading module, a scheduling part configured to generate equipment control information for scheduling the operations of the process module, the index module, and the loading module, and a transmission part configured to transmit the equipment control information to the process module, the index module, and the loading module.

According to another aspect of the present disclosure, there is provided a substrate treating method of controlling a substrate treating apparatus including a process module configured to perform processing on a substrate, an index module configured to insert the substrate into the process module and withdraw the substrate, of which the processing is completed, from the process module, and a loading module configured to relay the substrate between the process module in a vacuum atmosphere and the index module in an atmospheric pressure atmosphere by switching an atmosphere thereof to the vacuum atmosphere or the atmospheric pressure atmosphere, the method including receiving operation states from the process module, the index module, and the loading module, generating equipment control information for scheduling operations of the process module, the index module, and the loading module in a direction in which the number of substrates to be processed per unit time increases with reference to the received operation states, and transmitting the equipment control information to the process module, the index module, and the loading module.

The operation state may include at least one from among a main-processing state or a post-processing state of at least one process unit provided in the process module, a substrate transport state of at least one transport arm provided in a transport robot of the process module, a substrate transport state of at least one index arm provided in an index robot of the index module, and an exhaust state or an intake state of a load lock chamber and an unload lock chamber that are provided in the loading module.

The generating of the equipment control information may include scheduling the operations of the process module, the index module, and the loading module in a direction in which an idle time of at least one process unit provided in the process module, an idle time of a transport robot provided in the process module, and an idle time of an index robot provided in the index module are reduced.

The generating of the equipment control information may include scheduling the operations of the process module, the index module, and the loading module with reference to environment information of the process module, the index module, and the loading module.

The environment information may include at least one from among a main-processing time and a post-processing time of at least one process unit provided in the process module, the number of available transport arms provided in a transport robot of the process module, the number of available index arms provided in an index robot of the index module, and an exhaust time and an intake time of each of a load lock chamber and an unload lock chamber that are provided in the loading module.

The equipment control information may include at least one equipment control element for controlling each piece of equipment provided in the process module, the index module, and the loading module.

The equipment control element may include at least one from among a time point at which the substrate accommodated in a carrier of the index module is withdrawn for processing, a time point at which the substrate is transported from a load lock chamber of the loading module to the process module, a time point at which the substrate is transported from an unload lock chamber of the loading module to the index module, and a processing priority in the case in which the substrate before processing and the substrate after processing are mixed in the load lock chamber of the loading module.

The generating of the equipment control information may include learning the scheduled operation states of the process module, the index module, and the loading module using a machine learning technique, and newly scheduling the operations of the process module, the index module, and the loading module with reference to the learned result.

The machine learning technique may include reinforcement learning.

Other details of exemplary embodiments for solving the above problems are included in the detailed description and the drawings.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF EXAMPLE EMBODIMENTS

Figure 1:
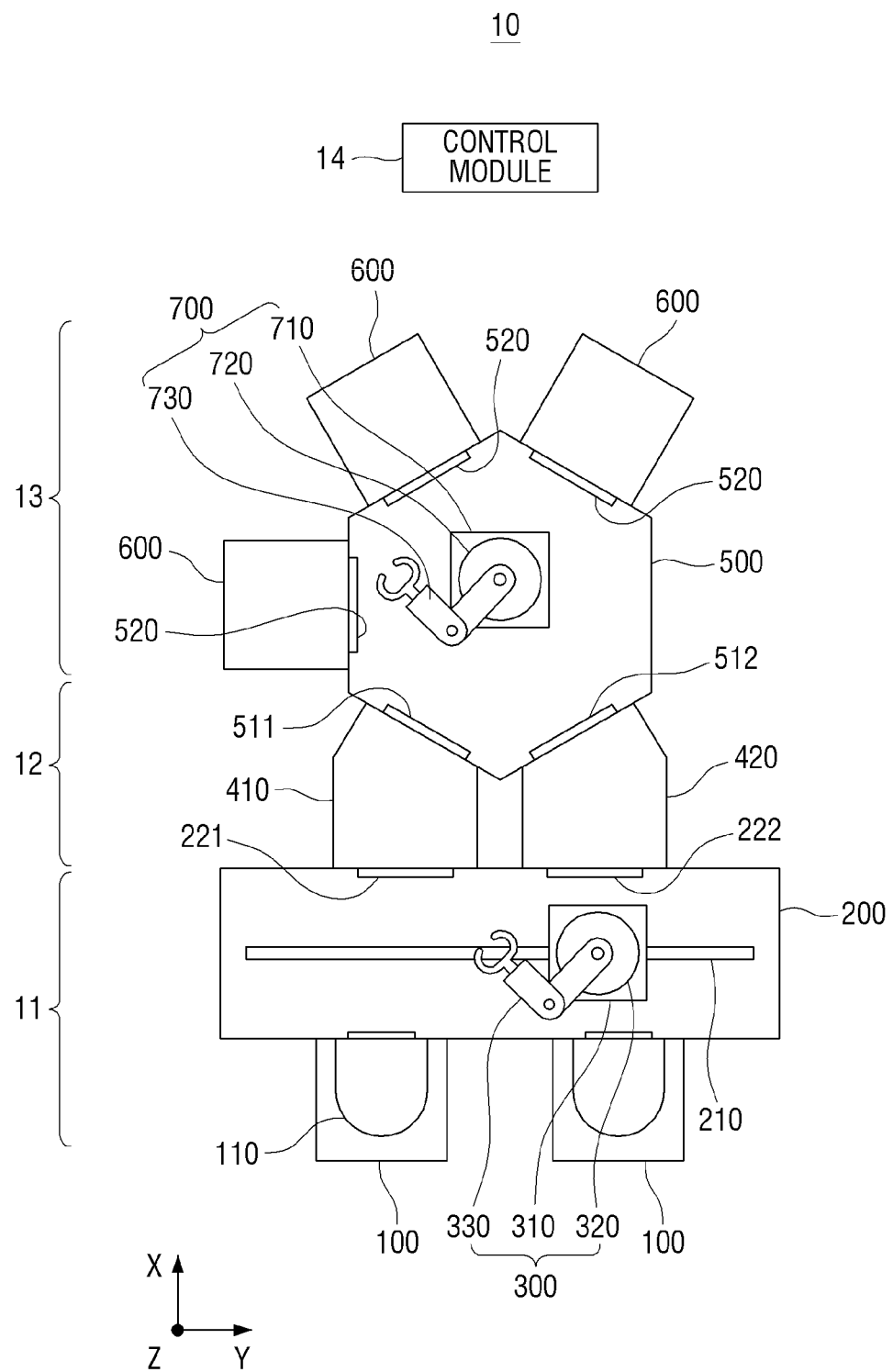
FIG. 1 is a view illustrating a substrate treating apparatus according to an exemplary embodiment of the present disclosure.

Hereinafter, exemplary embodiments of the present disclosure will be described in detail with reference to the accompanying drawings. The advantages and features of the present disclosure and methods for obtaining the same will be apparent from the following detailed description of the exemplary embodiments described with references to the following drawings. However, the present disclosure is not limited to the exemplary embodiments to be disclosed below and may be implemented in different various forms. The present exemplary embodiments are provided in order to fully explain the present disclosure and fully explain the scope of the present disclosure to those skilled in the art. The scope of the present disclosure is only defined by the appended claims. Like reference numerals refer to like elements throughout the specification.

A case in which an element or layer is referred to as being "on" another element or layer includes a case in which the element is directly present on another element or layer and also includes a case in which the element is present on another element or layer with still another element or layer interposed therebetween. However, a case in which an element is referred to as being "directly on" another element includes a case in which still another element or layer is not interposed therebetween.

Spatially relative terms such as "below," "beneath," "lower," "above," "upper," and the like may be used to more easily describe a relationship between one element or component and another element or another component as illustrated in the drawings. The spatially relative terms should be understood to have directions as illustrated in the drawings and have other directions when the elements are used or operated. For example, when an element illustrated in the drawing is turned upside down, the element which is illustrated to be present below or beneath another element may be present above another element. Accordingly, the term "below" used as an example includes both "below" and "above." An element may be arranged in another direction, and thus, the spatially relative terms may be interpreted based on an arrangement direction.

Although first, second, and the like are used to describe various elements, components, and/or sections, the various elements, components, and/or sections are not limited thereto. The terms are only for distinguishing one element or component, or sections from another element or component, or sections. Therefore, a first element, a first component, or a first section may also be a second element, a second component, or a second section in the technical spirit of the present disclosure.

The terms used herein are for the purpose of describing the exemplary embodiments and are not intended to limit the present disclosure. Unless the context clearly indicates otherwise in the specification, the singular forms include the plural forms. The terms "comprises," "comprising," "includes," and/or "including," when used herein, specify the presence of stated features, integers, steps, operations, elements, components and/or groups thereof and do not preclude the presence or addition of one or more other features, integers, steps, operations, elements, components, and/or groups thereof.

Unless otherwise defined, all terms (including technical and scientific terms) used herein may be used in a sense commonly understood by those skilled in the art to which the present disclosure pertains. It will be further understood that terms, such as those defined in commonly used dictionaries, will not be interpreted in an idealized or overly formal sense unless expressly so defined here.

Hereinafter, the exemplary embodiments of the present disclosure will be described in detail with reference to the accompanying drawings. When the exemplary embodiments are described with reference to the accompanying drawings, components that are the same or correspond to each other are denoted by the same reference numerals regardless of the figure numbers, and redundant descriptions will be omitted.

FIG. 1 is a view illustrating a substrate treating apparatus according to an exemplary embodiment of the present disclosure.

Referring to FIG. 1, a substrate treating apparatus 10 includes an index module 11, a loading module 12, a process module 13, and a control module 14.

The index module 11, the loading module 12, and the process module 13 may be arranged in a line. Hereinafter, a direction in which the index module 11, the loading module 12, and the process module 13 are arranged will be referred to as a first direction X, a direction perpendicular to the first direction X when viewed from the top will be referred to as a second direction Y, and a direction perpendicular to a plane including the first direction X and the second direction Y will be referred to as a third direction Z.

The index module 11 serves to insert a substrate into the process module 13 and withdraw the substrate, in which processing is completed, from the process module 13. The loading module 12 may be provided between the index module 11 and the process module 13. The index module 11 may insert the substrate into the process module 13 or withdraw the substrate from the loading module 12 through the loading module 12.

The index module 11 may transport the substrate from a carrier 110, in which the substrate is accommodated, to the loading module 12 and accommodate the substrate discharged from the loading module 12 in the carrier 110. The index module 11 may include a load port 100 and a transport frame 200.

The carrier 110 may be seated on the load port 100. A plurality of substrates may be accommodated in the carrier 110. A plurality of load ports 100 may be provided, and the plurality of load ports 100 may be arranged in a line in the second direction Y.

The carrier 110 may include a slot (not shown) that supports an edge of the substrate. A plurality of slots may be provided along the third direction Z. Thus, the plurality of substrates may be stacked inside the carrier 110 while being spaced apart from each other in the third direction Z. A front opening unified pod (FOUP) may be used as the carrier 110.

The transport frame 200 serves to transport the substrate between the carrier 110 and the loading module 12. The transport frame 200 may include an index rail 210 and an index robot 300.

The index rail 210 may be arranged to be elongated in parallel to the second direction Y. The index robot 300 is installed on the index rail 210 and may move in the second direction Y along the index rail 210. The index robot 300 may include an index base 310, an index body 320, and an index arm 330. The index base 310 may be installed on the index rail 210 such that the index base 310 is movable along the index rail 210. The index body 320 may move along the index rail 210 together with the index base 310 by being coupled to the index base 310. In addition, the index body 320 may move in the third direction Z with respect to the index base 310 and may also rotate about a rotational axis parallel to the third direction Z.

The index arm 330 serves to transport the substrate by directly support the substrate. To this end, the index arm 330 may include a plurality of joints capable of adjusting an angle or a length thereof with respect to each other. Although FIG. 1 illustrates one index arm 330 provided on the index body 320, a plurality of index arms 330 may be provided on the index body 320. When the plurality of index arms 330 are provided, a portion of the plurality of index arms 330 may be used to transport the substrates from the loading module 12 to the carrier 110, and another portion of the plurality of index arms 330 may be used to transport the substrates from the carrier 110 to the loading module 12. Since the plurality of index arms 330 perform transport operations differently from each other, particles generated on the substrate before processing may be prevented from adhering to the substrate after processing.

The loading module 12 serves to relay the substrate between the process module 13 in a vacuum atmosphere and the index module 11 in an atmospheric pressure atmosphere by switching an atmosphere thereof to the vacuum atmosphere or the atmospheric pressure atmosphere. An interior of the process module 13 may be in the vacuum atmosphere, and the index module 11 may be in the atmospheric pressure atmosphere. In order for the substrate to be exchanged between the process module 13 and the index module 11 while maintaining the vacuum atmosphere of the process module 13, the loading module 12 may be provided.

The loading module 12 may be disposed between a transport chamber 500 of the process module 13 and the transport frame 200. The loading module 12 may provide a space in which the substrate stays before the substrate is transported between the transport chamber 500 and the transport frame 200. The loading module 12 may include a load lock chamber 410 and an unload lock chamber 420. The load lock chamber 410 and the unload lock chamber 420 may each be provided such that an atmosphere of an internal space thereof is switchable to a vacuum atmosphere or an atmospheric pressure atmosphere.

The load lock chamber 410 serves to temporarily accommodate the substrate transported from the index module 11 to the process module 13. The index module 11 and the process module 13 may be provided with doors 221 and 511 with the load lock chamber 410 interposed therebetween. Hereinafter, among the doors provided on both sides of the load lock chamber 410, the door provided in the index module 11 will be referred to as a first index door 221, and the door provided in the process module 13 will be referred to as a first transport door 511.

When the substrate is loaded into the load lock chamber 410, the first index door 221 and the first transport door 511 may be closed and the internal space of the load lock chamber 410 may be sealed with respect to the index module 11 and the process module 13. After being sealed, the atmosphere of the internal space of the load lock chamber 410 may be switched from the atmospheric pressure atmosphere to the vacuum atmosphere. And then, as the first transport door 511 is opened while the first index door 221 is closed, the substrate of the load lock chamber 410 may be unloaded and transported to the transport chamber 500.

The unload lock chamber 420 serves to temporarily accommodate the substrate that is transported from the process module 13 to the index module 11. The index module 11 and the process module 13 may be provided with doors 222 and 512 with the unload lock chamber 420 interposed therebetween. Hereinafter, among the doors provided on both sides of the unload lock chamber 420, the door provided in the index module 11 will be referred to as a second index door 222, and the door provided in the process module 13 will be referred to as a second transport door 512.

When the substrate is loaded into the unload lock chamber 420, the second index door 222 and the second transport door 512 are closed, and the internal space of the unload lock chamber 420 is sealed with respect to the index module 11 and the process module 13. After being sealed, the atmosphere of the internal space of the unload lock chamber 420 may be switched from the vacuum atmosphere to the atmospheric pressure atmosphere. And then, as the second index door 222 is opened while the second transport door 512 is closed, the substrate of the unload lock chamber 420 may be unloaded and transported to the index module 11.

The process module 13 may perform processing on the substrate. The process module 13 may include the transport chamber 500 and a process unit 600. A plurality of process units 600 may be provided.

The transport chamber 500 may provide a space for relaying the substrate between the load lock chamber 410, the unload lock chamber 420, and the process unit 600. To this end, the load lock chamber 410, the unload lock chamber 420, and the process unit 600 may be disposed along an edge of the transport chamber 500. FIG. 1 illustrates the load lock chamber 410, the unload lock chamber 420, and three process units 600 disposed along the edge of the transport chamber 500 having a hexagonal shape. However, the shape of the transport chamber 500 of the present disclosure may not be limited to the hexagonal shape, and the shape of the transport chamber 500 may vary depending on the number of the process units 600.

A process door 520 may be provided for each process unit 600. In a state in which the process door 520 is opened, substrate loading or substrate unloading may be performed between the transport chamber 500 and the process unit 600, and in a state in which the process door 520 is closed, a processing operation by the process unit 600 may be performed.

A transport robot 700 may be provided inside the transport chamber 500. The transport robot 700 may serve to transport the substrate between the load lock chamber 410, the unload lock chamber 420, and the process unit 600. For example, the transport robot 700 may move the substrate, which is unloaded from the load lock chamber 410, and load the substrate into the process unit 600. In addition, the transport robot 700 may move the substrate, which is unloaded from the process unit 600, and load the substrate into the unload lock chamber 420.

The transport robot 700 may include a transport base 710, a transport body 720, and a transport arm 730. The transport base 710 may be disposed at the center of the transport chamber 500. The transport body 720 may move in the third direction Z with respect to the transport base 710 and may also rotate about a rotational axis parallel to the third direction Z.

The transport arm 730 serves to transport the substrate by directly support the substrate. To this end, the transport arm 730 may include a plurality of joints capable of adjusting an angle or a length with respect to each other. Thus, the transport arm 730 may perform a movement parallel to a plane including the first direction X and the second direction Y. Although FIG. 1 illustrates one transport arm 730 provided in the transport body 720, a plurality of transport arms 730 may be provided in the transport body 720. When the plurality of transport arms 730 are provided, a portion of the plurality of transport arms 730 may be used to transport the substrate from the load lock chamber 410 to the process unit 600, and another portion of the plurality of transport arms 730 may be used to transport the substrate from the process unit 600 to the unload lock chamber 420.

The process unit 600 may perform a specific operation on the substrate. For example, the process unit 600 may perform an etching or deposition process on the substrate. The process module 13 may include the plurality of process units 600, and the same operation or different operations may be performed in each of the process units 600.

The control module 14 serves to receive operation states from the process module 13, the index module 11, and the loading module 12 and schedule operations of the process module 13, the index module 11, and the loading module 12 in a direction in which the number of substrates to be processed per unit time increases with reference to the received operation states.

The process module 13, the index module 11, and the loading module 12 may operate organically with each other. The substrate starting from the carrier 110 of the index module 11 may be loaded into the process unit 600 of the process module 13 through the load lock chamber 410 of the loading module 12 and may be processed in the process unit 600. And then, the processed substrate may be loaded into another process unit 600 to perform another processing or may be loaded into the index module 11 through the unload lock chamber 420 of the loading module 12 and accommodated in the carrier 110 of the index module 11. Such a process is repeatedly performed, and the process module 13, the index module 11, and the loading module 12 may operate organically with each other to perform processing for each substrate.

Meanwhile, when any piece of equipment provided in each module is in an idle state, this may lead to a reduction in production output. For example, when the loading of the substrate into the process module 13 is delayed, an idle state may occur in the process unit 600, and the production output may be reduced by as much as an idle time.

The control module 14 may schedule operations of the process module 13, the index module 11, and the loading module 12 in a direction in which an idle time of at least one process unit 600 provided in the process module 13, an idle time of the transport robot 700 provided in the process module 13, and an idle time of the index robot 300 provided in the index module 11 are reduced. As the idle time of each piece of equipment is reduced, the number of substrates to be processed per unit time may be increased.

The operation states of the process module 13, the index module 11, and the loading module 12 that the control module 14 receives may include at least one from among a main-processing state or a post-processing state of at least one process unit 600 provided in the process module 13, a substrate transport state of at least one transport arm 730 provided in the transport robot 700 of the process module 13, a substrate transport state of at least one index arm 330 provided in the index robot 300 of the index module 11, and an exhaust state or an intake state of the load lock chamber 410 and the unload lock chamber 420 that are provided in the loading module 12.

The operation of the process unit 600 may include main processing and post-processing. The term "main processing" refers to processing performed on the substrate after the substrate is loaded into the process unit 600, and the term "post-processing" refers to processing performed with respect to the interior of the process unit 600 after the substrate is unloaded from the process unit 600. The preparation of the processing for a new substrate may be completed through the post-processing. The main-processing state described above indicates a state in which the process unit 600 is carrying out the main processing, and the post-processing state described above indicates a state in which the process unit 600 is carrying out the post-processing.

The substrate transport state of the transport arm 730 described above indicates a state in which the substrate is being transported by the transport arm 730, and the substrate transport state of the index arm 330 described above indicates a state in which the substrate is being transported by the index arm 330.

The exhaust state described above indicates a state in which the load lock chamber 410 or the unload lock chamber 420 discharges air to switch the atmosphere thereof to the vacuum atmosphere, and the intake state described above indicates a state in which the load lock chamber 410 or the unload lock chamber 420 suctions air to switch the atmosphere thereof to the atmospheric pressure atmosphere.

The operation states may be transmitted periodically. That is, each of the process unit 600, the transport robot 700, the load lock chamber 410, the unload lock chamber 420, and the index robot 300 may transmit its operation state to the control module 14 at predetermined time intervals. In this case, the process unit 600, the transport robot 700, the load lock chamber 410, the unload lock chamber 420, and the index robot 300 may simultaneously transmit or separately transmit the operation states thereof.

Alternatively, the operation state may be transmitted only when an event has occurred. That is, each of the process unit 600, the transport robot 700, the load lock chamber 410, the unload lock chamber 420, and the index robot 300 may transmit the changed operation state when its operation state is changed. For example, when the operation state is changed from the main-processing state to the post-processing state, the process unit 600 may transmit the operation state indicating that it is in the post-processing state to the control module 14 or transmit the operation state indicating that it has transitioned from the main-processing state to the post-processing state to the control module 14. Similarly, when the operation state is changed from the exhaust state to the intake state, the load lock chamber 410 may transmit the operation state indicating that it is in the intake state to the control module 14 or transmit the operation state indicating that it has transitioned from the exhaust state to the intake state to the control module 14.

The control module 14 may check whether each piece of equipment performs a certain operation or is in an idle state at each time point with reference to the received operation state and reschedule the operation for each piece of equipment based on the result of the check.

The control module 14 may also schedule the operations of the process module 13, the index module 11, and the loading module 12 with reference to environment information of the process module 13, the index module 11, and the loading module 12.

In the present disclosure, the environment information indicates an operable environment or a set environment for the equipment provided in each module 11, 12, 13. For example, the environment information may include at least one from among a main-processing time and a post-processing time of at least one process unit 600 provided in the process module 13, the number of transport arms 730 provided and available in the transport robot 700 of the process module 13, the number of index arms 330 provided and available in the index robot 300 of the index module 11, and an exhaust time and an intake time of each of the load lock chamber 410 and the unload lock chamber 420 that are provided in the loading module 12.

The main-processing time and the post-processing time may be varied depending on the process. For example, a main-processing time and a post-processing time in a photolithography process may be different from a main-processing time and a post-processing time in an etching process. Each of the process units 600 may set the main-processing time and the post-processing time as the environment information thereof according to the process processed by the corresponding process unit 600.

The transport robot 700 may be provided with only one transport arm 730 or may be provided with two or more transport arms 730. Similarly, the index robot 300 may be provided with only one index arm 330 or may be provided with two or more index arms 330. Meanwhile, even though the transport robot 700 and the index robot 300 are each provided with the plurality of transport arms 730 or the plurality of index arms 330, the number of provided arms may be different from the number of available arms. In this case, the number of available arms may be set as the environment information.

The exhaust time and the intake time of the load lock chamber 410 may be different depending on the process. Similarly, the exhaust time and the intake time of the unload lock chamber 420 may be different depending on the process. Depending on the process, the exhaust time and the intake time of the load lock chamber 410 may be set as the environment information, and the exhaust time and the intake time of the unload lock chamber 420 may be set as the environment information.

A user may set the environment information for each piece of equipment before allowing the processing on the substrate to be performed in the equipment. For example, for a first process unit, the user may set a first main-processing time and a first post-processing time as environment information of the first process unit, and for a second process unit, the user may set a second main-processing time and a second post-processing time as environment information of the second process unit. In addition, the user may set the number of available transport arms 730 in the transport robot 700 as environment information of the transport robot 700 and set the number of available index arms 330 in the index robot 300 as environment information of the index robot 300. In addition, the user may set the exhaust time and the intake time for each of the load lock chamber 410 and the unload lock chamber 420 as environment information for each of the load lock chamber 410 and the unload lock chamber 420. The control module 14 may perform scheduling with reference to the environment information of each piece of equipment, which is set by the user.

The control module 14 may generate and transmit equipment control information for scheduling the operations of the process module 13, the index module 11, and the loading module 12. The equipment control information may include control information for controlling the equipment. Each piece of equipment provided in the process module 13, the index module 11, and the loading module 12 may operate according to the received equipment control information to perform processing on the substrate.

The control module 14 learns the scheduled operation states of the process module 13, the index module 11, and the loading module 12 using machine learning techniques to newly schedule the operations of the process module 13, the index module 11, and the loading module 12. The control module 14 may receive an operation state of each piece of equipment provided in the process module 13, the index module 11, and the loading module 12 and schedule the operation of each piece of equipment based on the operation state. Accordingly, each piece of equipment may operate according to the scheduling of the control module 14 and transmit the operation state thereof back to the control module 14. Thus, the control module 14 may newly schedule the operation of each piece of equipment based on the received operation state of each piece of equipment. The receiving of the operation state and the scheduling based on the operation state may be performed repeatedly, and each time the operation state is received, the control module 14 may learn the received operation state and perform scheduling for each piece of equipment in a direction in which the number of substrates to be processed per unit time increases.

The machine learning techniques performed by the control module 14 may include reinforcement learning. The term "reinforcement learning" refers to a machine learning technique that attempts various behaviors and attempts a particular behavior more frequently when the particular behavior meets a target. When it is determined that the equipment is operated in a direction in which the number of substrates to be processed per unit time increases by referring to the operation state of the equipment according to a specific scheduling method, the control module 14 may apply the corresponding scheduling method more frequently.

Figure 2:
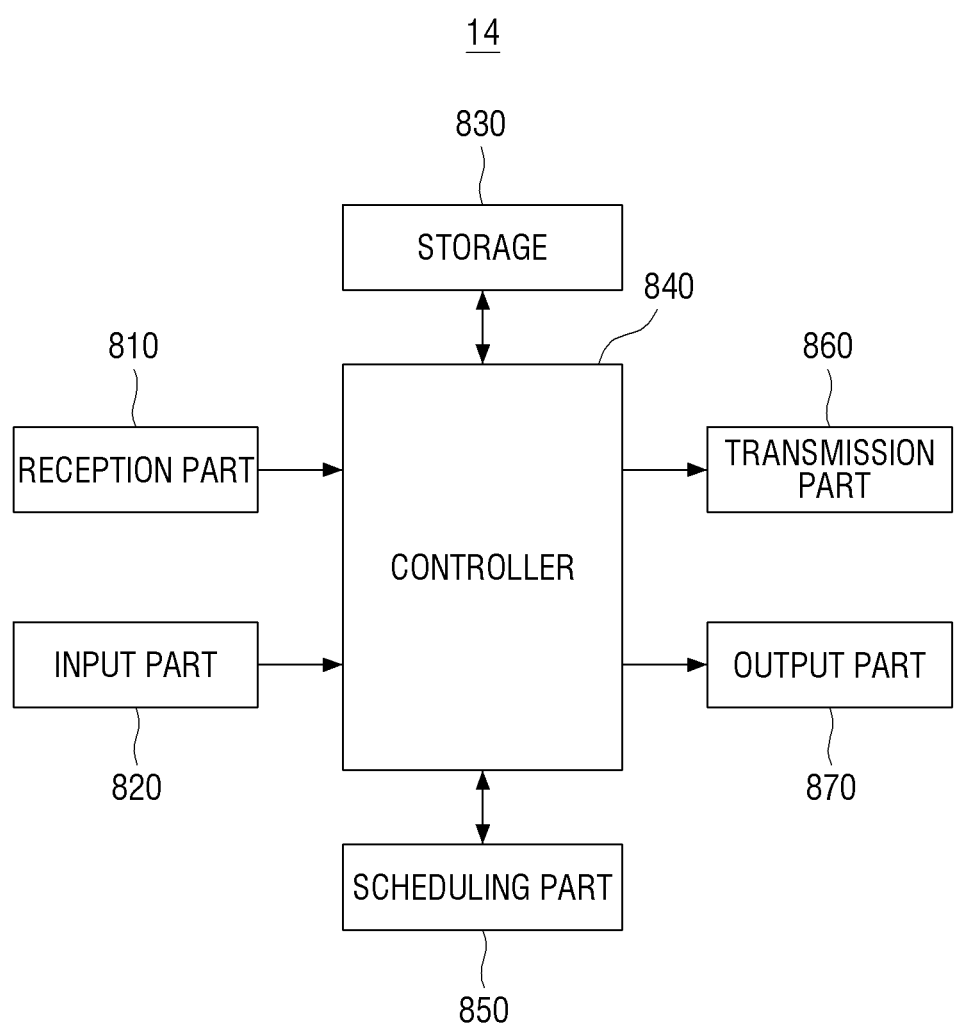
FIG. 2 is a block diagram illustrating a control module according to the exemplary embodiment of the present disclosure.

FIG. 2 is a block diagram illustrating the control module according to the exemplary embodiment of the present disclosure.

Referring to FIG. 2, the control module 14 includes a reception part 810, an input part 820, a storage 830, a controller 840, a scheduling part 850, a transmission part 860, and an output part 870.

The reception part 810 serves to receive the operation states from the process module 13, the index module 11, and the loading module 12. To this end, a wired or wireless communication channel may be formed between each piece of equipment provided in the process module 13, the index module 11, and the loading module 12 and the reception part 810.

The input part 820 serves to receive the environment information of each piece of equipment, which is provided in the process module 13, the index module 11, and the loading module 12, from the user. To this end, the input part 820 may include a button, a wheel, a jog shuttle, and the like. The user may input the main-processing time and the post-processing time of the process unit 600, the number of the transport arms 730 and the number of the index arms 330, and the exhaust time and the intake time of each of the load lock chamber 410 and the unload lock chamber 420 through the input part 820.

The storage 830 may temporarily or permanently store the operation state received through the reception part 810 and the environment information input through the input part 820.

The scheduling part 850 serves to generate the equipment control information for scheduling the operations of the process module 13, the index module 11, and the loading module 12. The scheduling part 850 may schedule the operation of the equipment with reference to the operation state and the environment information, which are stored in the storage 830, and generate the equipment control information including the scheduling information.

The transmission part 860 serves to transmit the equipment control information generated by the scheduling part 850 to the process module 13, the index module 11, and the loading module 12. To this end, a wired or wireless communication channel may be formed between each piece of equipment provided in the process module 13, the index module 11, and the loading module 12 and the transmission part 860.

The output part 870 may output general information about the operation of the equipment. For example, the output part 870 may include a display part (not shown) and a speaker (not shown). The output part 870 may output the current operation state of each piece of equipment, the number of substrates to be processed per unit time, and the like.

The controller 840 performs overall control of the reception part 810, the input part 820, the storage 830, the scheduling part 850, the transmission part 860, and the output part 870.

Figure 3:
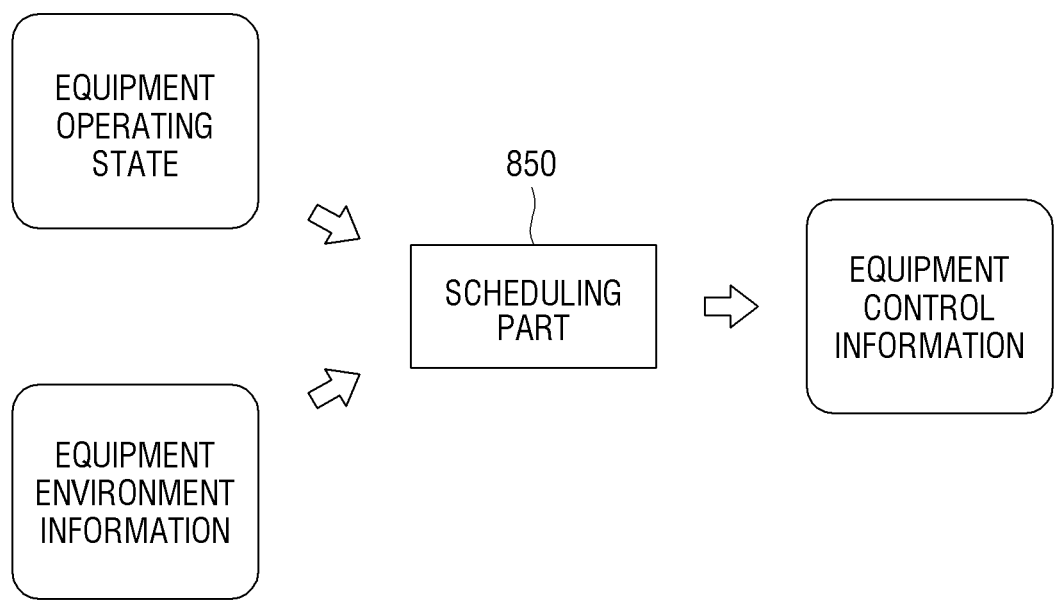
FIG. 3 is a view illustrating an operation of a scheduling part according to the exemplary embodiment of the present disclosure.

FIG. 3 is a view illustrating the operation of the scheduling part according to the exemplary embodiment of the present disclosure.

Referring to FIG. 3, the scheduling part 850 may generate the equipment control information with reference to the operation state and the environment information of the equipment.

The operation state of the equipment may be received from each piece of equipment, and the environment information of the equipment may be set by input from the user.

Figure 4:
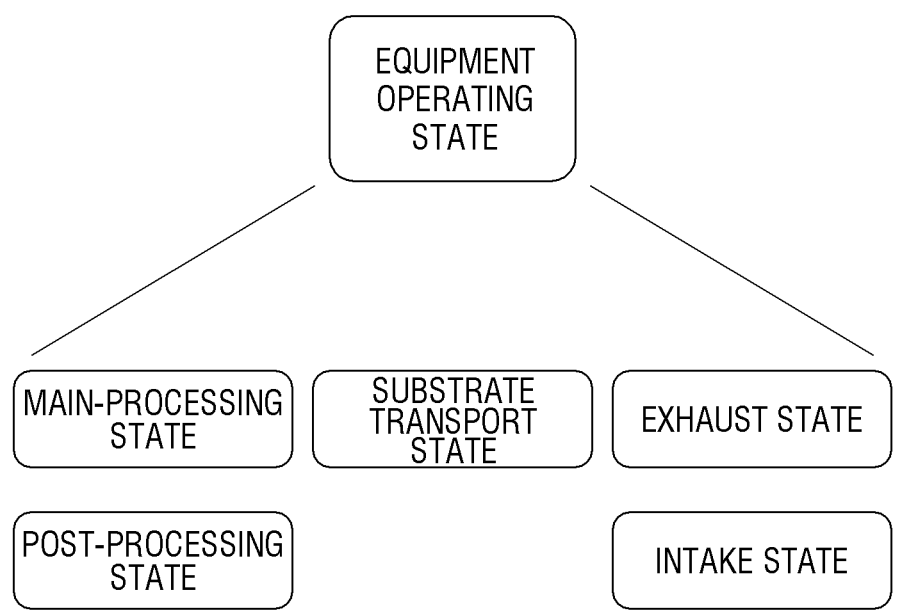
FIG. 4 is a view illustrating equipment operating states according to the exemplary embodiment of the present disclosure.

FIG. 4 is a view illustrating equipment operating states according to the exemplary embodiment of the present disclosure.

Referring to FIG. 4, the equipment operating states may include the main-processing state or the post-processing state of the process unit 600, the substrate transport state by the transport robot 700 or the index robot 300, and the exhaust state or intake state of the load lock chamber 410 and the unload lock chamber 420.

Figure 5:
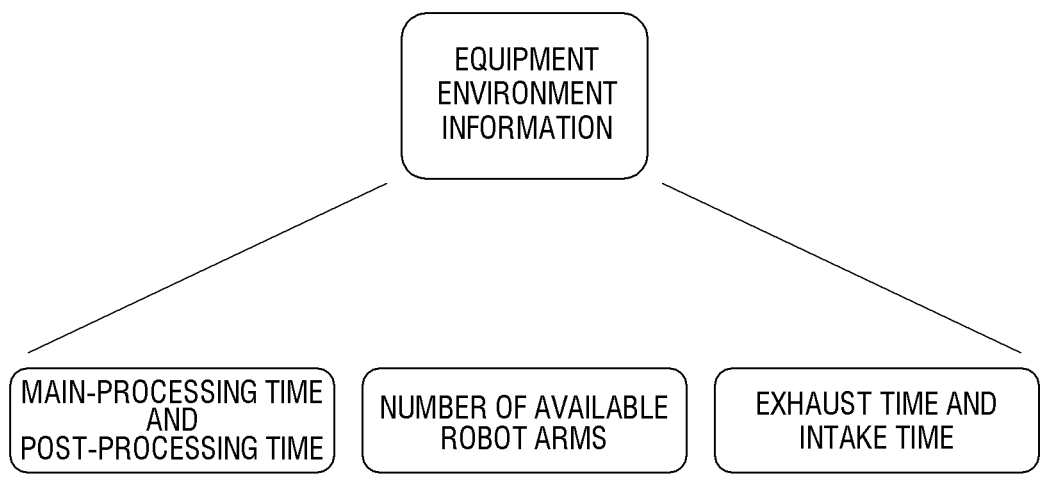
FIG. 5 is a view illustrating equipment environment information according to the exemplary embodiment of the present disclosure.

FIG. 5 is a view illustrating the equipment environment information according to the exemplary embodiment of the present disclosure.

Referring to FIG. 5, the equipment environment information may include the main-processing time and the post-processing time of the process unit 600, the number of available robot arms provided in the transport robot 700 or the index robot 300, and the exhaust time and the intake time of each of the load lock chamber 410 and the unload lock chamber 420.

Figure 6:
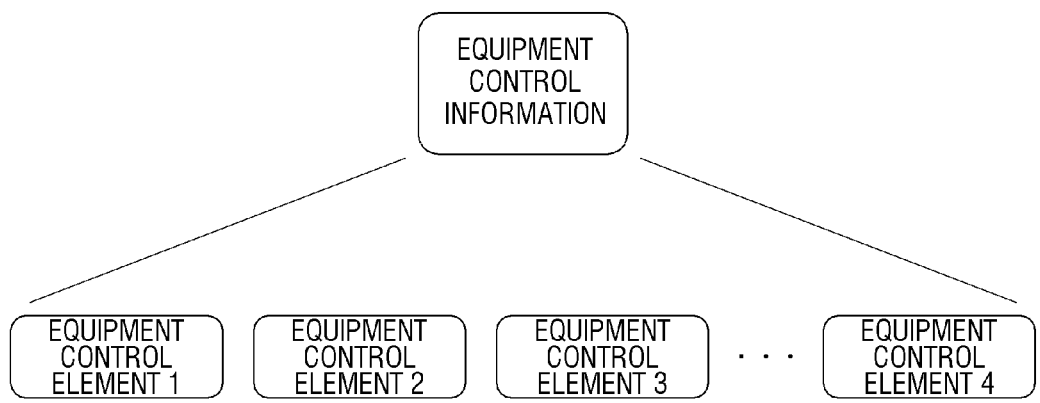
FIG. 6 is a view illustrating equipment control information according to the exemplary embodiment of the present disclosure.

FIG. 6 is a view illustrating the equipment control information according to the exemplary embodiment of the present disclosure.

Referring to FIG. 6, the equipment control information may include at least one equipment control element for controlling each piece of equipment provided in the process module 13, the index module 11 and the loading module 12.

As described above, the equipment control information may include the control information for controlling each piece of equipment. For example, the equipment control information may include control information for controlling the process unit 600, control information for controlling the transport robot 700, control information for controlling the index robot 300, control information for controlling the load lock chamber 410, and control information for controlling the unload lock chamber 420.

The control information for each piece of equipment may be included in the equipment control information in the form of an equipment control element. In the present disclosure, it can be understood that the equipment control element includes control information for implementing a specific operation using one piece of equipment or a collaborative operation using two or more pieces of equipment.

For example, the equipment control element may include at least one from among a time point at which the substrate accommodated in the carrier 110 of the index module 11 is withdrawn for processing, a time point at which the substrate is transported from the load lock chamber 410 of the loading module 12 to the process module 13, a time point at which the substrate is transported from the unload lock chamber 420 of the loading module 12 to the index module 11, and a processing priority in the case in which the substrates before processing and the substrates after processing are mixed in the load lock chamber 410 of the loading module 12.

The index robot 300 may withdraw the substrate from the carrier 110 at a withdrawal time-point included in a particular equipment control element. The transport robot 700 may transport the substrate from the load lock chamber 410 to the process module 13 at a time point included in another equipment control element, and the index robot 300 may withdraw the substrate from the unload lock chamber 420 at a time point included in still another equipment control element. The doors 520, 221, 222, 511, and 512 provided in the process unit 600, the load lock chamber 410, and the unload lock chamber 420 may be opened and closed according to the unloading or loading of the substrate by the transport robot 700 and the index robot 300.

Figure 7:
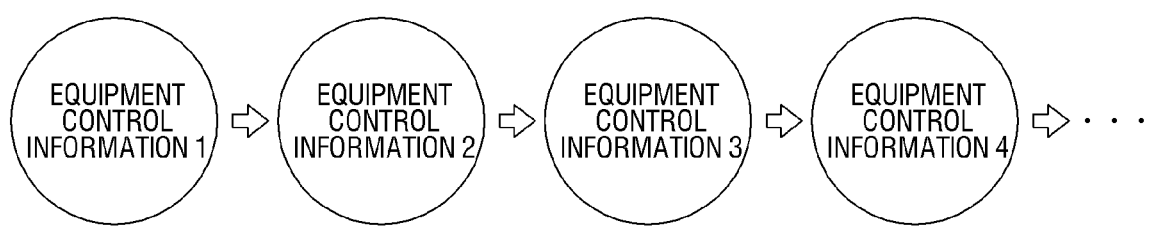
FIG. 7 is a view illustrating the equipment control information according to the exemplary embodiment of the present disclosure being sequentially changed.
Figure 8:
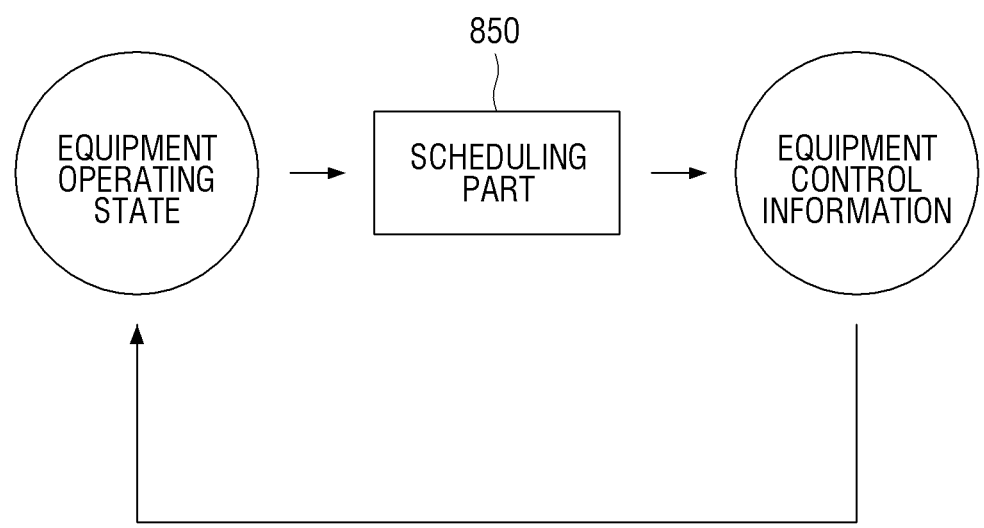
FIG. 8 is a view illustrating the case in which the equipment operating state is learned by the scheduling part according to the exemplary embodiment of the present disclosure so that the equipment control information is newly generated.

FIG. 7 is a view illustrating the equipment control information according to the exemplary embodiment of the present disclosure being sequentially changed, and FIG. 8 is a view illustrating the case in which the equipment operating state is learned by the scheduling part 850 according to the exemplary embodiment of the present disclosure so that the equipment control information is newly generated.

Referring to FIGS. 7 and 8, the equipment control information according to the exemplary embodiment of the present disclosure may be changed sequentially.

The scheduling part 850 of the control module 14 may receive the operation state from the equipment provided in the process module 13, the index module 11, and the loading module 12 and generate the equipment control information for scheduling each piece of equipment with reference to the received operation state. The scheduling part 850 may generate the equipment control information while changing a value set in each equipment control element. For example, the scheduling part 850 may generate the equipment control information by setting the equipment control element such that a new substrate is withdrawn from the carrier 110 after the processing on the substrate is started in the process unit 600 and a specific time has elapsed. In this case, the scheduling part 850 may generate the equipment control information while changing the elapsed time until the processing on the substrate is started and the new substrate is withdrawn.

In generating the equipment control information, the scheduling part 850 learns the operation state of the equipment using machine learning techniques to newly schedule the operation of the equipment. In particular, the scheduling part 850 may perform scheduling by reinforcement learning that aims to increase the number of substrates to be processed per unit time, and accordingly, as the scheduling is repeated by the scheduling part 850, the number of substrates to be processed per unit time increases.

While the exemplary embodiments of the present disclosure have been described with reference to the accompanying drawings, those skilled in the art will understand that the present disclosure can be implemented in other specific forms without departing from the technical spirit or the necessary features of the present disclosure. Therefore, the above-described exemplary embodiments should be considered as only examples in all aspects and not for purposes of limitation.

What is claimed is:

1. A substrate treating apparatus comprising:
  a process module configured to perform processing on a substrate;
  an index module configured to insert the substrate into the process module and withdraw the substrate, of which the processing is completed, from the process module;
  a loading module configured to relay the substrate between the process module in a vacuum atmosphere and the index module in an atmospheric pressure atmosphere by switching an atmosphere thereof to the vacuum atmosphere or the atmospheric pressure atmosphere; and
  a control module that receives operation states from the process module, the index module, and the loading module only when changes in the respective operation states occur, and schedules operations of the process module, the index module, and the loading module in a direction in which the number of substrates to be processed per unit time increases with reference to the received operation states.

2. The substrate treating apparatus of claim 1,
  wherein the operation states include:
  a main-processing state or a post-processing state of at least one process unit provided in the process module;
  a substrate transport state of at least one transport arm provided in a transport robot of the process module;

a substrate transport state of at least one index arm provided in an index robot of the index module; and an exhaust state or an intake state of a load lock chamber and an unload lock chamber that are provided in the loading module.

3. The substrate treating apparatus of claim 1, wherein the control module schedules the operations of the process module, the index module, and the loading module in a direction in which an idle time of at least one process unit provided in the process module, an idle time of a transport robot provided in the process module, and an idle time of an index robot provided in the index module are reduced.

4. The substrate treating apparatus of claim 1, wherein the control module schedules the operations of the process module, the index module, and the loading module with reference to environment information of the process module, the index module, and the loading module.

5. The substrate treating apparatus of claim 4,
wherein the environment information includes:
a main-processing time and a post-processing time of at least one process unit provided in the process module;
the number of available transport arms provided in a transport robot of the process module;
the number of available index arms provided in an index robot of the index module; and
an exhaust time and an intake time of each of a load lock chamber and an unload lock chamber that are provided in the loading module.

6. The substrate treating apparatus of claim 1, wherein the control module generates and transmits equipment control information for scheduling the operations of the process module, the index module, and the loading module.

7. The substrate treating apparatus of claim 6, wherein the equipment control information includes at least one equipment control element for controlling each piece of equipment provided in the process module, the index module, and the loading module.

8. The substrate treating apparatus of claim 7,
wherein the equipment control element includes:
a time point at which the substrate accommodated in a carrier of the index module is withdrawn for processing;
a time point at which the substrate is transported from a load lock chamber of the loading module to the process module;
a time point at which the substrate is transported from an unload lock chamber of the loading module to the index module; and
a processing priority in the case in which the substrate before processing and the substrate after processing are mixed in the load lock chamber of the loading module.

9. The substrate treating apparatus of claim 1, wherein the control module learns the scheduled operation states of the process module, the index module, and the loading module using a machine learning technique to newly schedule the operations of the process module, the index module, and the loading module.

10. The substrate treating apparatus of claim 9, wherein the machine learning technique includes reinforcement learning.

11. The substrate treating apparatus of claim 1,
wherein the control module includes:
a reception part configured to receive the operation states from the process module, the index module, and the loading module only when changes in the respective operation states occur;
a scheduling part configured to generate equipment control information for scheduling the operations of the process module, the index module, and the loading module; and
a transmission part configured to transmit the equipment control information to the process module, the index module, and the loading module.

12. A substrate treating method of controlling a substrate treating apparatus including a process module configured to perform processing on a substrate, an index module configured to insert the substrate into the process module and withdraw the substrate, of which the processing is completed, from the process module, and a loading module configured to relay the substrate between the process module in a vacuum atmosphere and the index module in an atmospheric pressure atmosphere by switching an atmosphere thereof to the vacuum atmosphere or the atmospheric pressure atmosphere, the method comprising:
receiving operation states from the process module, the index module, and the loading module only when changes in the respective operation states occur;
generating equipment control information for scheduling operations of the process module, the index module, and the loading module in a direction in which the number of substrates to be processed per unit time increases with reference to the received operation states; and
transmitting the equipment control information to the process module, the index module, and the loading module.

13. The method of claim 12,
wherein the operation states include:
a main-processing state or a post-processing state of at least one process unit provided in the process module;
a substrate transport state of at least one transport arm provided in a transport robot of the process module;
a substrate transport state of at least one index arm provided in an index robot of the index module; and
an exhaust state or an intake state of a load lock chamber and an unload lock chamber that are provided in the loading module.

14. The method of claim 12, wherein the generating of the equipment control information includes scheduling the operations of the process module, the index module, and the loading module in a direction in which an idle time of at least one process unit provided in the process module, an idle time of a transport robot provided in the process module, and an idle time of an index robot provided in the index module are reduced.

15. The method of claim 12, wherein the generating of the equipment control information includes scheduling the operations of the process module, the index module, and the loading module with reference to environment information of the process module, the index module, and the loading module.

16. The method of claim 15,
wherein the environment information includes:
a main-processing time and a post-processing time of at least one process unit provided in the process module;
the number of available transport arms provided in a transport robot of the process module;
the number of available index arms provided in an index robot of the index module; and
an exhaust time and an intake time of each of a load lock chamber and an unload lock chamber that are provided in the loading module.

17. The method of claim 12, wherein the equipment control information includes at least one equipment control element for controlling each piece of equipment provided in the process module, the index module, and the loading module.

18. The method of claim 17,
wherein the equipment control element includes:
a time point at which the substrate accommodated in a carrier of the index module is withdrawn for processing;
a time point at which the substrate is transported from a load lock chamber of the loading module to the process module;
a time point at which the substrate is transported from an unload lock chamber of the loading module to the index module; and
a processing priority in the case in which the substrate before processing and the substrate after processing are mixed in the load lock chamber of the loading module.

19. The method of claim 12,
wherein the generating of the equipment control information includes:
learning the scheduled operation states of the process module, the index module, and the loading module using a machine learning technique; and
newly scheduling the operations of the process module, the index module, and the loading module with reference to the learned result.

20. The method of claim 19, wherein the machine learning technique includes reinforcement learning.

* * * * *